(12) United States Patent
Buff et al.

(10) Patent No.: US 8,466,431 B2
(45) Date of Patent: Jun. 18, 2013

(54) TECHNIQUES FOR IMPROVING EXTRACTED ION BEAM QUALITY USING HIGH-TRANSPARENCY ELECTRODES

(75) Inventors: James S. Buff, Brookline, NH (US); Svetlana Radovanov, Marblehead, MA (US); Bon-Woong Koo, Andover, MA (US); Wilhelm Platow, Somerville, MA (US); Frank Sinclair, Quincy, MA (US); D. Jeffrey Lischer, Acton, MA (US); Craig R. Chaney, Rockport, MA (US); Steven Borichevsky, Gloucester, MA (US); Eric R. Cobb, Danvers, MA (US); Mayur Jagtap, Burlington, MA (US); Kenneth H. Purser, Gloucester, MA (US); Victor Benveniste, Lyle, WA (US); Shardul S. Patel, North Reading, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 353 days.

(21) Appl. No.: 12/370,555

(22) Filed: Feb. 12, 2009

(65) Prior Publication Data

US 2010/0200768 A1 Aug. 12, 2010

(51) Int. Cl.
*H01J 37/15* (2006.01)
*G21K 5/10* (2006.01)

(52) U.S. Cl.
USPC ............... 250/423 R; 250/492.21; 250/492.1; 250/492.3

(58) Field of Classification Search
USPC ............. 250/492.21, 423 R, 282, 281, 396 R, 250/424
See application file for complete search history.

(56) References Cited

U.S. PATENT DOCUMENTS

| | | | |
|---|---|---|---|
| 5,920,076 A | 7/1999 | Burgin et al. |
| 6,326,631 B1 | 12/2001 | Politiek et al. |
| 6,441,382 B1 | 8/2002 | Huang |
| 6,489,622 B1 | 12/2002 | Chen et al. |
| 6,498,348 B2 | 12/2002 | Aitken |
| 6,559,454 B1 | 5/2003 | Murrell et al. |
| 6,573,517 B1 | 6/2003 | Sugitani et al. |
| 6,710,358 B1 | 3/2004 | Chen et al. |
| 6,777,696 B1 | 8/2004 | Rathmell et al. |
| 6,881,966 B2 | 4/2005 | Benveniste et al. |
| 6,946,667 B2 | 9/2005 | Chen et al. |
| 7,022,984 B1 | 4/2006 | Rathmell et al. |
| 7,045,799 B1 | 5/2006 | Chang et al. |

(Continued)

FOREIGN PATENT DOCUMENTS

| | | |
|---|---|---|
| JP | 04 284 343 | 10/1992 |
| JP | 11 329 316 | 11/1999 |
| JP | 2003257329 A | 9/2003 |
| KR | 20050068729 A | 7/2005 |

*Primary Examiner* — Jack Berman
*Assistant Examiner* — Johnnie Smith

(57) ABSTRACT

Techniques for improving extracted ion beam quality using high-transparency electrodes are disclosed. In one particular exemplary embodiment, the techniques may be realized as an apparatus for ion implantation. The apparatus may comprise an ion source for generating an ion beam, wherein the ion source comprises a faceplate with an aperture for the ion beam to travel therethrough. The apparatus may also comprise a set of extraction electrodes comprising at least a suppression electrode and a high-transparency ground electrode, wherein the set of extraction electrodes may extract the ion beam from the ion source via the faceplate, and wherein the high-transparency ground electrode may be configured to optimize gas conductance between the suppression electrode and the high-transparency ground electrode for improved extracted ion beam quality.

20 Claims, 9 Drawing Sheets

U.S. PATENT DOCUMENTS

| | | |
|---|---|---|
| 7,098,614 B2 | 8/2006 | Yamashita |
| 7,112,809 B2 | 9/2006 | Rathmell et al. |
| 7,271,399 B2 | 9/2007 | Bong et al. |
| 7,888,662 B2 * | 2/2011 | Biloiu et al. .............. 250/492.21 |
| 7,928,406 B2 * | 4/2011 | Horsky et al. ............. 250/423 R |
| 2007/0241689 A1 * | 10/2007 | Horsky et al. ............ 315/111.91 |
| 2007/0262270 A1 * | 11/2007 | Huang et al. .............. 250/492.21 |
| 2008/0290266 A1 * | 11/2008 | Horsky et al. ................. 250/281 |
| 2009/0212232 A1 * | 8/2009 | Yamashita et al. ........ 250/423 R |
| 2009/0302214 A1 * | 12/2009 | Igo et al. ....................... 250/282 |
| 2009/0314951 A1 * | 12/2009 | Biloiu et al. .............. 250/423 R |
| 2009/0314962 A1 * | 12/2009 | Dorai et al. ............... 250/492.21 |
| 2011/0240877 A1 * | 10/2011 | Benveniste et al. ........... 250/424 |
| 2011/0240878 A1 * | 10/2011 | Benveniste et al. ........... 250/424 |

* cited by examiner

TECHNIQUES FOR IMPROVING EXTRACTED ION BEAM QUALITY USING HIGH-TRANSPARENCY ELECTRODES

FIELD OF THE DISCLOSURE

The present disclosure relates generally to semiconductor manufacturing equipment and, more particularly, to techniques for improving extracted ion beam quality using high-transparency electrodes.

BACKGROUND OF THE DISCLOSURE

Ion implantation is a process of depositing chemical species into a substrate by direct bombardment of the substrate with energized ions. In semiconductor manufacturing, ion implanters are used primarily for doping processes that alter a type and level of conductivity of target materials. A precise doping profile in an integrated circuit (IC) substrate and its thin-film structure is often crucial for proper IC performance. To achieve a desired doping profile, one or more ion species may be implanted in different doses and at different energy levels.

FIG. 1 depicts a conventional ion implanter system 100. The ion implanter 100 includes a source power 101, an ion source 102, extraction electrodes 104, a 90° magnet analyzer 106, a first deceleration (D1) stage 108, a 70° magnet analyzer 110, and a second deceleration (D2) stage 112. The D1 and D2 deceleration stages (also known as "deceleration lenses") each comprising multiple electrodes with a defined aperture to allow an ion beam 10 to pass therethrough. By applying different combinations of voltage potentials to the multiple electrodes, the D1 and D2 deceleration lenses can manipulate ion energies and cause the ion beam 10 to hit a target workpiece 114 at a desired energy. A number of measurement devices 116 (e.g., a dose control Faraday cup, a traveling Faraday cup, or a setup Faraday cup) may be used to monitor and control the ion beam conditions.

The ion source 102 and extraction electrodes 104 are critical components of the ion implanter system 100. The ion source 102 and extraction electrodes 104 are required to generate a stable and reliable ion beam 10 for a variety of different ion species and extraction voltages.

FIG. 2 depicts a conventional ion source and extraction electrode configuration 200. Referring to FIG. 2, which is a schematic diagram of the conventional ion source and extraction electrode configuration 200, the ion source 102 is provided in a housing 201. The ion source 102 has a faceplate 203, which has an aperture from which the extraction electrodes 104 may extract ions from plasma in the ion source 102. The extraction electrodes 104 include a suppression electrode 205 and a ground electrode 207. As depicted in FIG. 2, the suppression electrode 205 and the ground electrode 207 are often double-slotted with different slot dimensions, large slot for high-energy implant application (e.g., >20 keV), and small slot for low-energy application (e.g., <20 keV).

It should be appreciated that arrows are shown in FIG. 2 to represent vacuum pumping directions. Vacuum pumping, as depicted by the arrows, is required to provide pressure level low enough for stable beam-extraction operation between the suppression electrode 205 and the ground electrode 207 for ion beam extraction.

FIGS. 3A-3B depict a conventional ground electrode 207. FIG. 3A depicts a three-dimensional view 300A of a conventional ground electrode 207. In this example, the ground electrode 207 is double-slotted, having a first slot 309a and a second slot 309b. FIG. 3B depicts a cross-sectional view 300B of the conventional ground electrode 207. The ground electrode 207 has a overall height H, which includes a base height b and a slot height a. The ground electrode 207 also has a base angle α and a slot angle β. In the conventional ground electrode 207, the base height b is greater than the slot height a and the base-to-slot height ratio may be expressed as b/a>1.

A problem that currently exists in conventional ion implantation is that as extraction current from the ion source 102 increases, undesirable beam shape may be observed at the target workpiece 114. This undesirable beam shape may provide "beam wiggles" that ultimately reduce uniformity in the ion beam 10. Although this problem may be associated with plasma instability and/or plasma oscillation inside the ion source 102, the extraction electrodes 104 play a critical role and may add to the problem. For example, mechanical imperfections and high background pressure at the extraction electrodes 104 may greatly amplify the "beam wiggles" and degrade ion beam quality.

FIG. 4 depicts an illustrative graph 400 of an extracted ion beam profile. In this example, a wiggle-shaped extracted ion beam profile 410 is depicted. As depicted in dotted lines, an ideal extracted ion beam profile 420 is provided. Although both the wiggle-shaped extracted ion beam profile 410 and the ideal extracted ion beam profile 420 have similar profiles, the ideal ion beam profile 420 has a smooth profile, which may be transported and tuned as a high quality ion beam at the target.

As described above, "beam wiggles" generated and/or amplified by the extraction electrodes 104 may lead to degraded beam uniformity and poor quality of the ion beam 10 at the target workpiece 114. In order to improve ion beam quality, the "beam wiggles" in the extracted ion beam profile 410 should be reduced to resemble more closely the ideal extracted ion beam profile 420. However, conventional systems and methods do not provide an adequate solution to reduce "beam wiggles" in an extracted ion beam profile.

In view of the foregoing, it may be understood that there are significant problems and shortcomings associated with current ion beam extraction technologies.

SUMMARY OF THE DISCLOSURE

Techniques for improving extracted ion beam quality using high-transparency electrodes are disclosed. In one particular exemplary embodiment, the techniques may be realized as an apparatus for ion implantation. The apparatus may comprise an ion source for generating an ion beam, wherein the ion source comprises a faceplate with an aperture for the ion beam to travel therethrough. The apparatus may also comprise a set of extraction electrodes comprising at least a suppression electrode and a high-transparency ground electrode, wherein the set of extraction electrodes may extract the ion beam from the ion source via the faceplate, and wherein the high-transparency ground electrode may be configured to optimize gas conductance between the suppression electrode and the high-transparency ground electrode for improved extracted ion beam quality.

In accordance with other aspects of this particular exemplary embodiment, the high-transparency ground electrode may be configured with an overall height H, one or more slot portions, a base angle θ, and a slot angle δ, wherein the overall height may comprise a base height y and a slot height x such that the base height y may be less than the slot height x and the base-to-slot height ratio y/x may be equal to or less than 1.

In accordance with further aspects of this particular exemplary embodiment, the base angle θ may be 20°.

In accordance with additional aspects of this particular exemplary embodiment, the base angle θ may be greater than 20°, such as 40°.

In accordance with other aspects of this particular exemplary embodiment, the high-transparency ground electrode may be a single-slot high-transparency ground electrode or a double-slot high-transparency ground electrode.

In accordance with further aspects of this particular exemplary embodiment, the ion source may be encased in a housing having a tapered configuration.

In accordance with additional aspects of this particular exemplary embodiment, the faceplate may be a protruded faceplate.

In accordance with other aspects of this particular exemplary embodiment, the suppression electrode may be a protruded suppression electrode.

In accordance with further aspects of this particular exemplary embodiment, the high-transparency ground electrode may further comprise one or more anchor portions positioned near one or more extraction slots of the high-transparency ground electrode for defining stable plasma boundaries inside of the high-transparency ground electrode.

In another particular exemplary embodiment, the techniques may be realized as a method for improving ion beam quality. The method may comprise providing an ion source comprising a plasma generator for generating an ion beam and a faceplate with an aperture for the ion beam to travel therethrough. The method may also comprise providing a set of extraction electrodes comprising at least a suppression electrode and a high-transparency ground electrode, wherein the set of extraction electrodes may extract the ion beam from the ion source via the faceplate, and wherein the high-transparency ground electrode may be configured to optimize gas conductance between the suppression electrode and the high-transparency ground electrode for improved ion beam quality.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure improve extracted ion beam quality by using high-transparency electrodes. More specifically, various geometric schemes and/or configurations for an ion source and extraction electrodes may provide improved vacuum characteristics for reducing "beam wiggles" in an extracted ion beam profile and improve overall ion beam quality.

Figure 1:
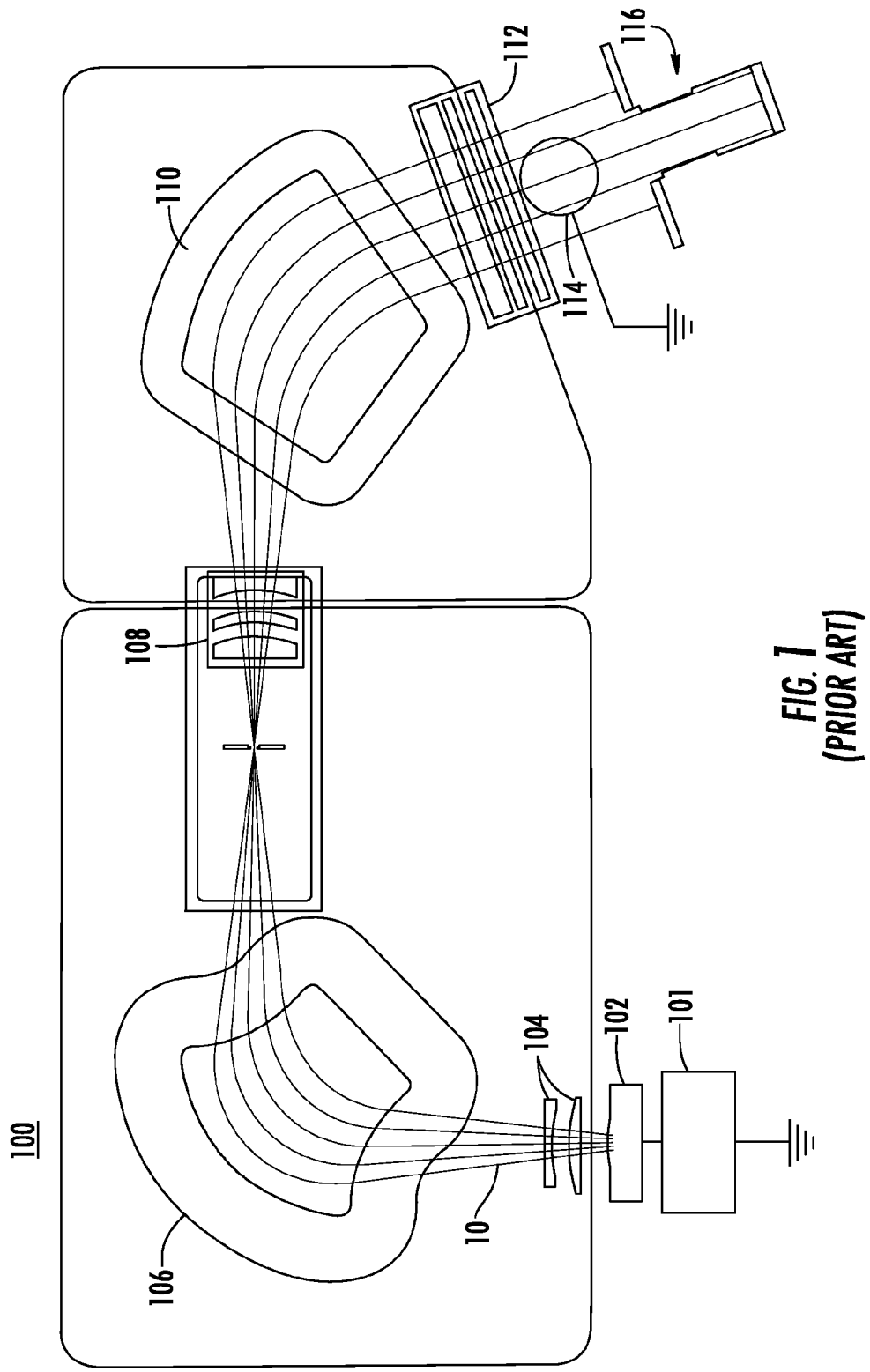
FIG. 1 depicts a conventional ion implanter system.
Figure 2:
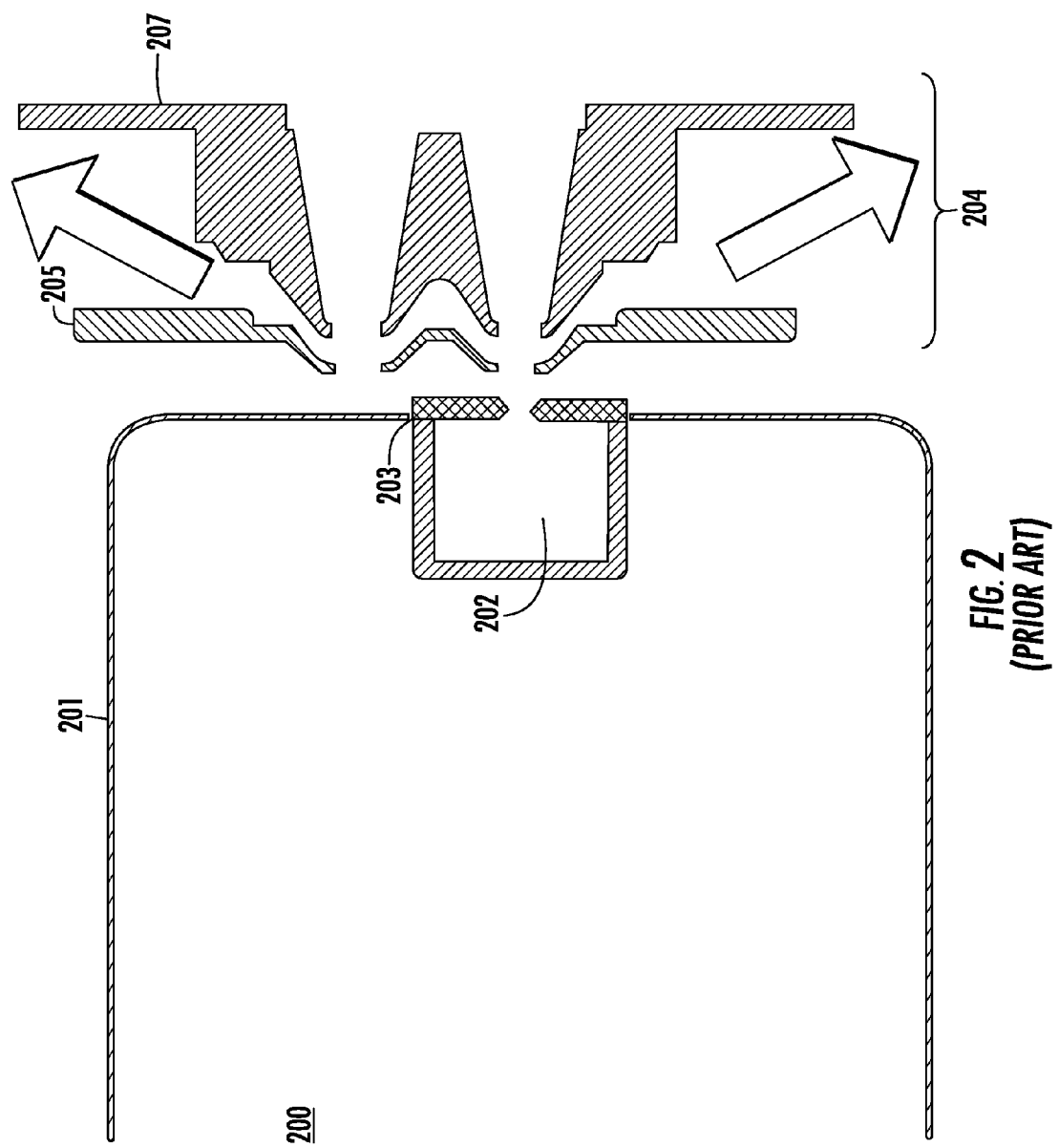
FIG. 2 depicts a conventional ion source and extraction electrode configuration.
Figure 3B:
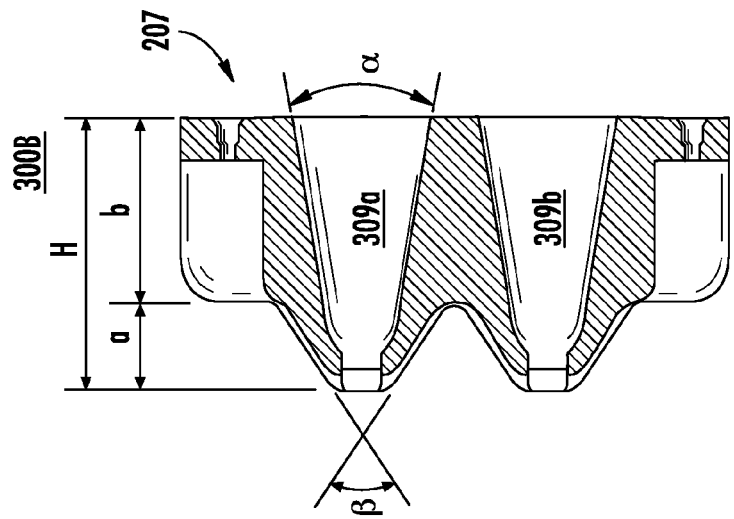
FIGS. 3A-3B depict a conventional ground electrode.
Figure 3A:
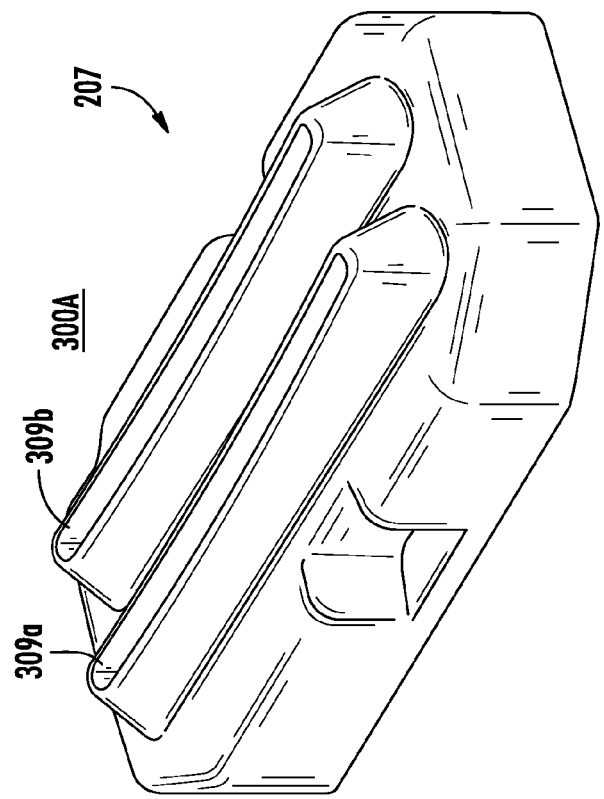
Figure 4:
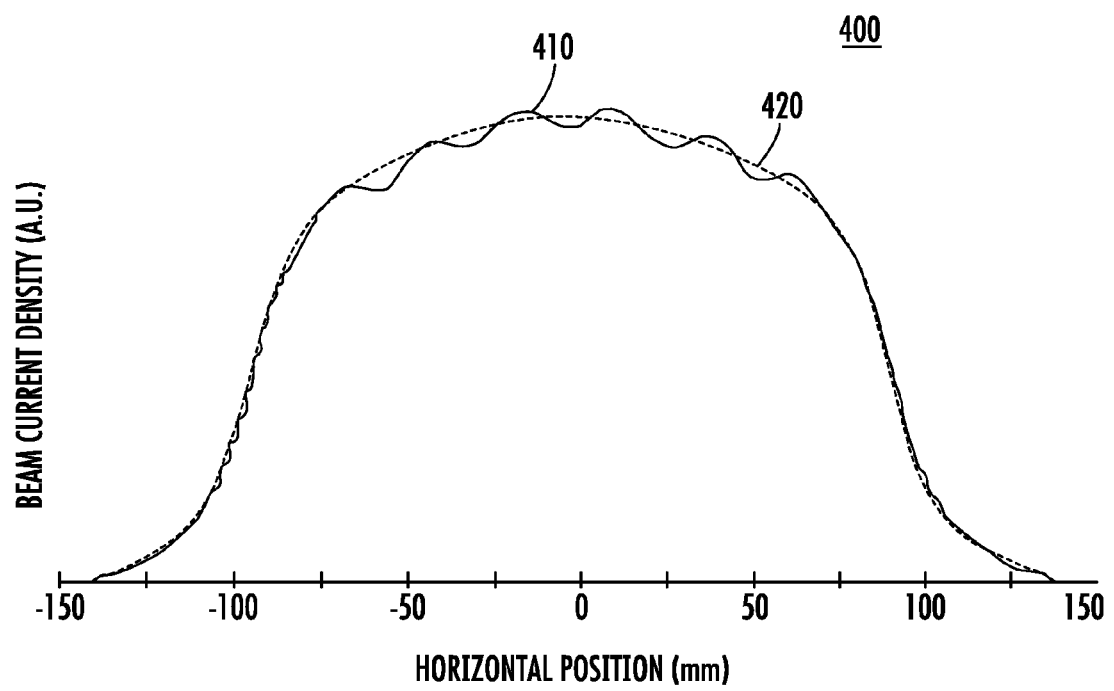
FIG. 4 depicts an illustrative graph of a wiggle-shaped extracted ion beam profile and an ideal extracted ion beam profile.
Figure 5:
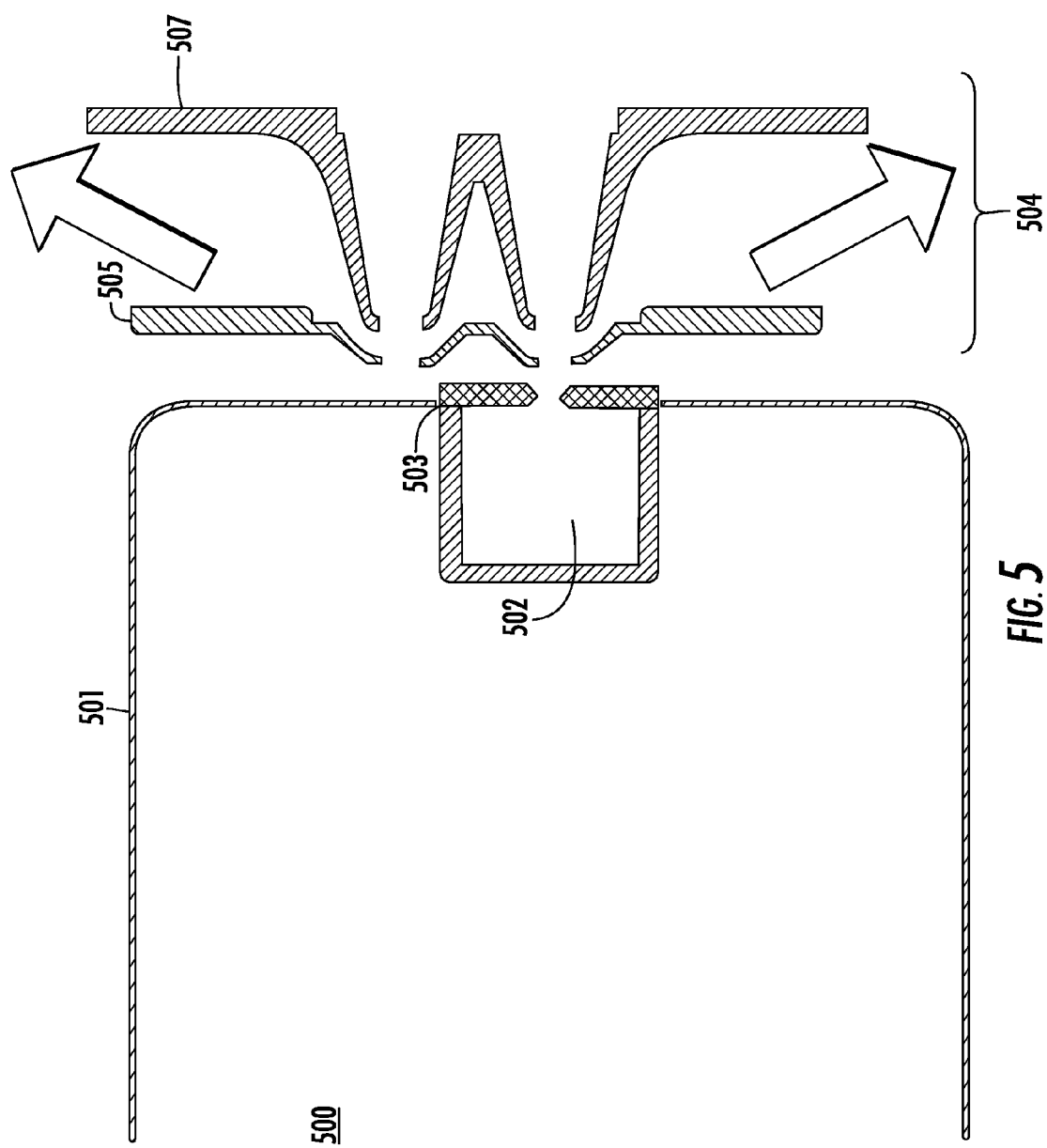
FIG. 5 depicts an ion source and extraction electrode configuration, according to an exemplary embodiment of the present disclosure.

FIG. 5 depicts an ion source and extraction electrode configuration 500 according to an exemplary embodiment of the present disclosure. Referring to FIG. 5, which depicts a schematic diagram of the ion source and extraction electrode configuration 500, an ion source 502 may be provided in a housing 501. The ion source 502 may have a faceplate 503 that includes an aperture from which extraction electrodes 504 may extract ions from plasma inside the ion source 502. The extraction electrodes 504 may include at least a suppression electrode 505 and a ground electrode 507.

In some embodiments, as depicted in FIG. 5, the suppression electrode 505 and the ground electrode 507 may be double-slotted. In this example, it should be appreciated that one slot may be for high-energy ion beam application (e.g., >20 keV) and another slot may be for low-energy ion beam application (e.g., <20 keV). However, unlike the conventional ground electrode 207 described above, the ground electrode 507 of FIG. 5 may be a high-transparency ground electrode 507 having a geometry that optimizes gas conductance in an extraction region (e.g., a region between the suppression electrode 505 and the ground electrode 507). It should be appreciated that large arrows are shown in FIG. 5 to represent vacuum pumping directions. As depicted by the large arrows, using the high-transparency ground electrode 507 may provide improved gas conductance in the extraction region (e.g., due to a large opening area) in a direction toward a turbo pump (not shown) (vertical) and an analyzer magnet (not shown) (horizontal).

Figure 6B:
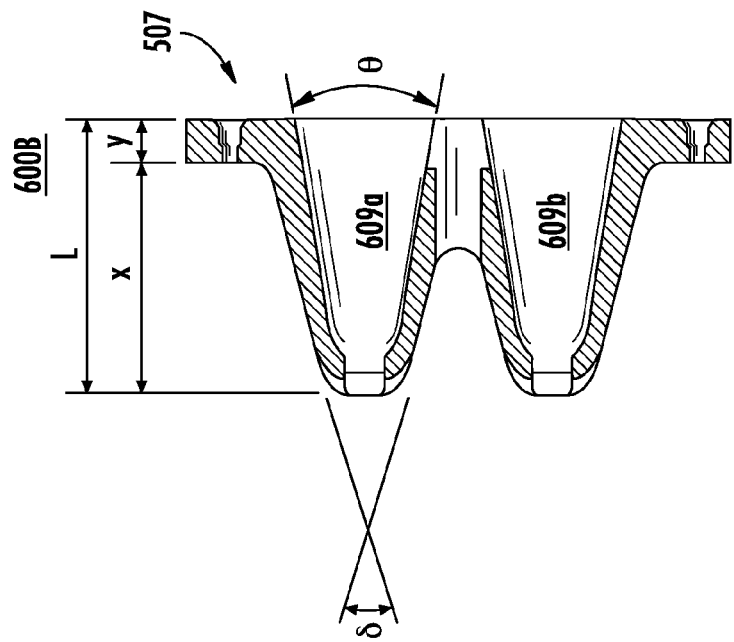
FIGS. 6A-6B depict a double-slot high-transparency ground electrode, according to an exemplary embodiment of the present disclosure.
Figure 6A:
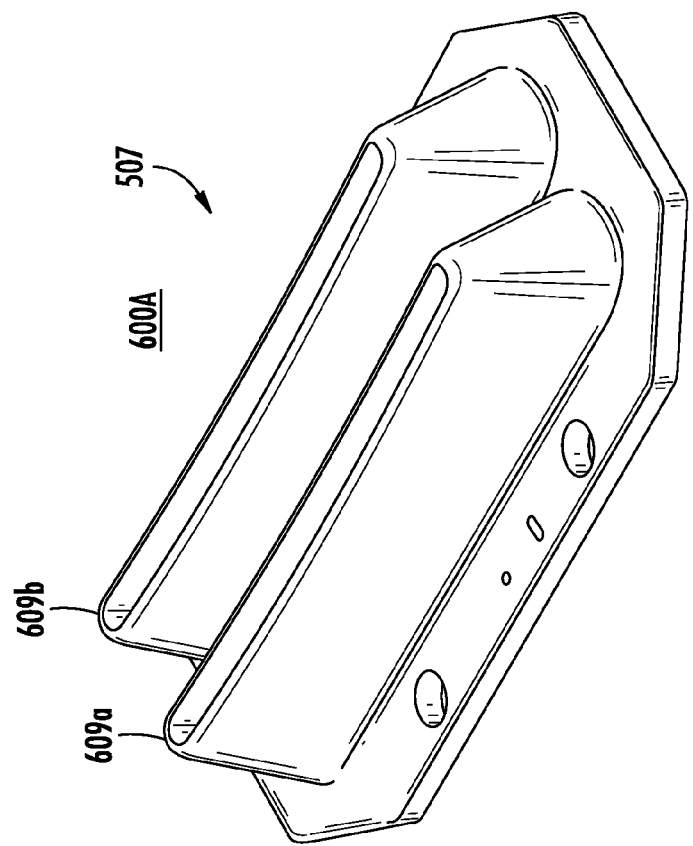

FIGS. 6A-6B depict views of the high-transparency ground electrode 507 according to an exemplary embodiment of the present disclosure. For example, FIG. 6A depicts a three-dimensional view 600A of the high-transparency ground electrode 507 according to an exemplary embodiment of the present disclosure. The high-transparency ground electrode 507 of FIG. 6A may be a double-slot high-transparency ground electrode 507 having a first slot 609a and a second slot 609b.

However, unlike the conventional ground electrode 207 described above, the double-slot high-transparency ground electrode 507 of FIGS. 6A-6B may have dimensions that provide improved gas conductance in the extraction region, especially between the suppression electrode 505 and the double-slot high-transparency ground electrode 507. In particular, the double-slot high-transparency ground electrode 507 may have a substantially reduced base portion. FIG. 6B depicts a cross-sectional view 600B of the double-slot high-transparency ground electrode 507. In this example, the double-slot high-transparency ground electrode 507 may have an overall height L, which includes a base height y and a slot height x. The double-slot high-transparency ground electrode 507 may also have a base angle θ and a slot angle δ. In some embodiments, the base angle θ may be 20°. It should be appreciated that the base height y may be lesser than the slot height x. Therefore, the base-to-slot height ratio may be expressed as y/x<1. It should also be appreciated that in some embodiments, the slot angle δ may be reduced as well.

The above-described double-slot high-transparency ground electrode 507 has a geometry that may provide improved gas conductance. More specifically, the overall volume of the ground electrode 507 may be reduced and therefore provide more room for effective vacuum pumping, which may improve gas conductance. Additionally, the double-slot high-transparency ground electrode 507 may be utilized in existing systems without additional alterations and/or modifications. Thus, using the double-slot high-transparency ground electrode 507 may provide a cost-effective way to optimize gas conductance and improve extracted ion beam quality.

Figure 7:
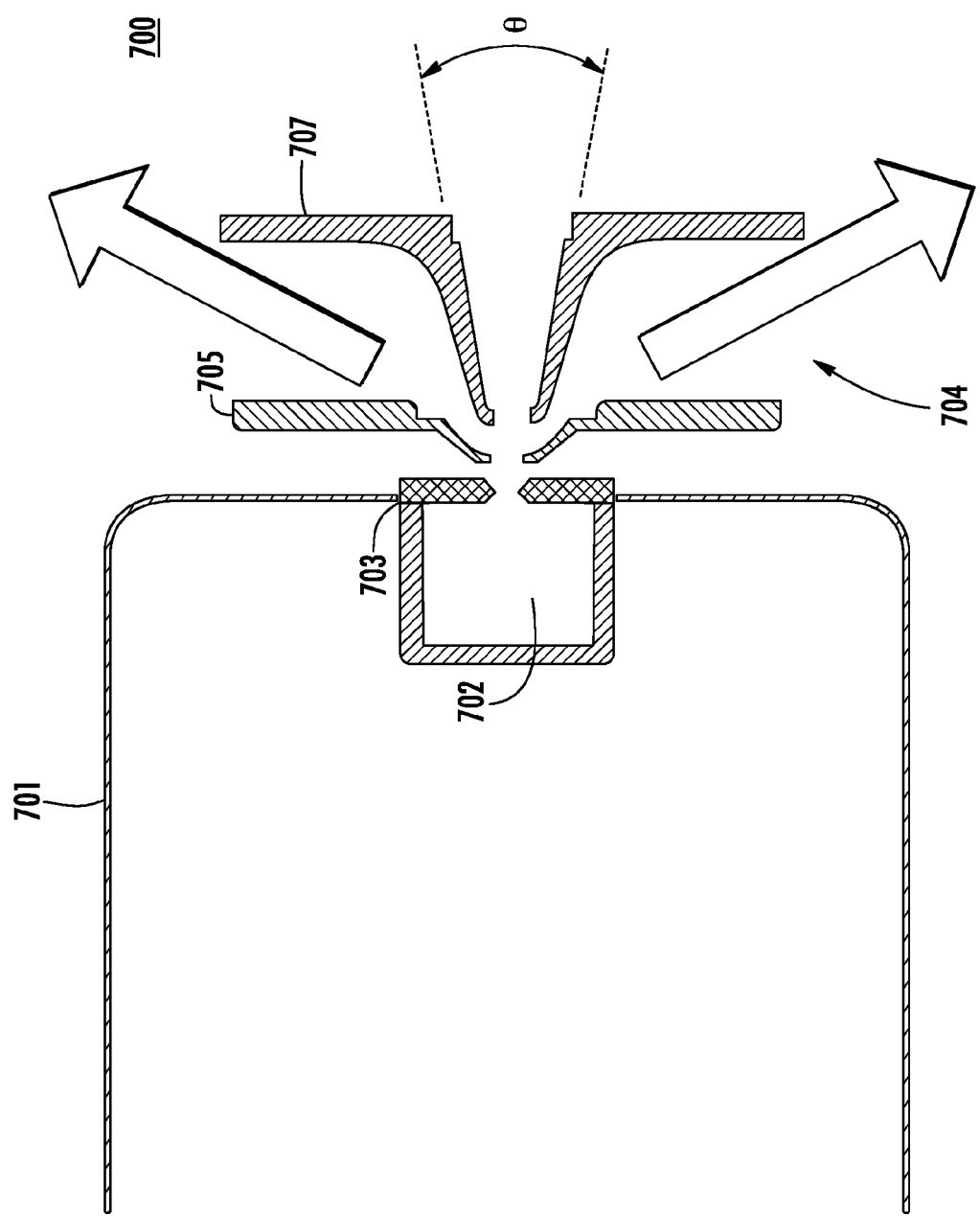
FIG. 7 depicts an ion source and extraction electrode configuration, according to another exemplary embodiment of the present disclosure.

FIG. 7 depicts an ion source and extraction electrode configuration 700 according to another exemplary embodiment of the present disclosure. Similar to FIG. 5, FIG. 7 depicts a schematic diagram of an ion source and extraction electrode configuration 700. Here, an ion source 702 may be provided in a housing 701. The ion source 702 may also have a faceplate 703 having an aperture from which extraction electrodes 704 may extract ions from plasma in the ion source 702. The extraction electrodes 704 may include a suppression electrode 705 and a high-transparency ground electrode 707.

However, unlike FIG. 5, the suppression electrode 705 and the high-transparency ground electrode 707 of FIG. 7 may be single-slotted. For similar reasons stated above, such geometric configurations may optimize gas conductance in the extraction region.

It should be appreciated that large arrows are shown in FIG. 7 to represent pumping directions. As depicted by the large arrows, using the single-slotted high-transparency ground electrode 707 may provide improved gas conductance in the extraction region (e.g., between the suppression electrode 705 and the ground electrode 507) in a direction toward a turbo pump (not shown) (vertical) and an analyzer magnet (not shown) (horizontal). Similar to FIG. 5, overall volume of the high-transparency ground electrode 707 may be reduced in a single-slot configuration and therefore provide more room for vacuum pumping and an improve ion beam profile.

Figure 8:
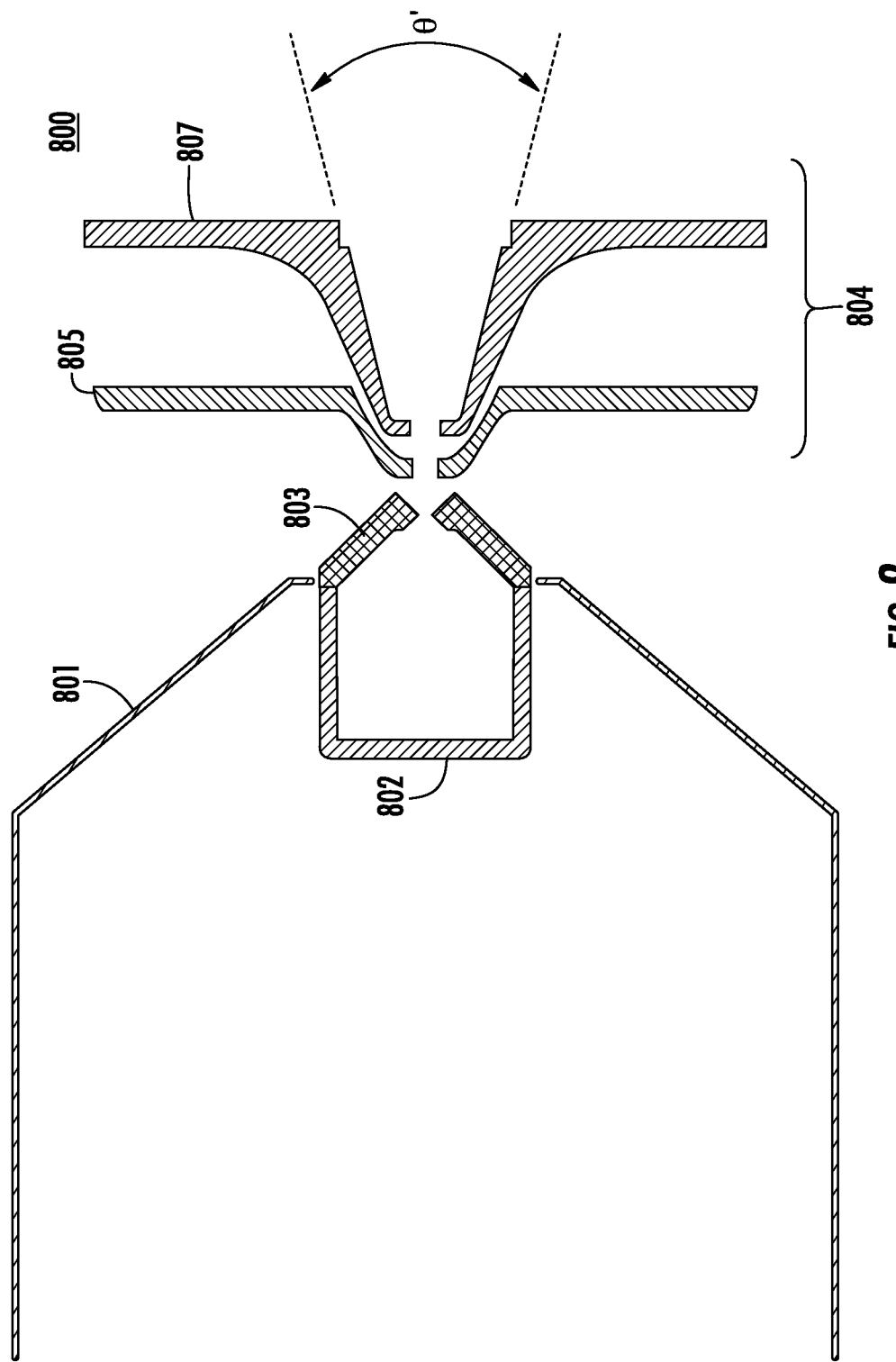
FIG. 8 depicts an ion source and extraction electrode configuration, according to another exemplary embodiment of the present disclosure.

A variety of additional geometric configurations may also be provided. For example, FIG. 8 depicts an ion source and extraction electrode configuration 800 according to another exemplary embodiment of the present disclosure. Similar to FIG. 7, FIG. 8 depicts a schematic diagram of an ion source and extraction electrode configuration 800. In this example, an ion source 802 may be provided in a housing 801. The ion source 802 may also have a faceplate 803 having an aperture from which extraction electrodes 804 may extract ions from the plasma in the ion source 802. The extraction electrodes 804 may include a suppression electrode 805 and a ground electrode 807, which in turn may be single-slotted.

However, unlike FIG. 7, the housing 801, the faceplate 803, the suppression electrode 805, and the ground electrode 807 of FIG. 8 may each have different geometric schemes and/or configurations. For instance, the housing 801 may have a tapered configuration (e.g., a tapered top hat configuration) and each of the faceplate 803, the suppression electrode 805, and the ground electrode 807 may have a protruded configuration. For similar reasons stated above, these various geometric configurations, independently or altogether, may optimize gas conductance and improve an extracted ion beam profile.

The tapered housing 801, as opposed to the conventional configuration (e.g., non-tapered configuration), may improve gas conductance between the faceplate 803 and the suppression electrode 805. A tapered shape may provide more room for gas conductance and may therefore minimize gas pressure for improved extracted ion beam quality. The protruded faceplate 803 may also improve gas conductance between the faceplate 803 and the suppression electrode 805.

According to an exemplary embodiment of the present disclosure, the protruded ion source faceplate 803 may be provided. In this example, rather than a conventional planar configuration, the protruded faceplate 803 may be sloped such that an extraction aperture of the protruded faceplate 803 may "protrude" towards the extraction electrodes.

It should be appreciated that while beam optics of the protruded faceplate 803 remain the same or similar to that of a conventional faceplate, the shape of the protruded faceplate 803 may provide an improved geometric scheme. Ultimately, a protruded shape may provide more space for improved gas conductance and may therefore lower gas pressure for improved extracted ion beam quality.

Referring back to FIG. 8, protruded extraction electrodes 804 may also improve gas conductance between the faceplate 803 and the suppression electrode 805. For example, the protruded suppression electrode 805 may extend further toward the faceplate 803 to improve gas conductance at a region between the faceplate 803 and the suppression electrode 805.

Additionally, in this configuration, the high-transparency ground electrode 807 may be protruded and widened to improve gas conductance as well. For example, in FIG. 8, the high-transparency ground electrode 807 may also have widened base angle θ'. In some embodiments, the widened base angle θ' may be twice that of the base angle θ from previous embodiments. For instance, in one embodiment, base angle θ' may be 40°. Other various embodiments may also be provided.

By using a protruded and widened high-transparency ground electrode 807, gas conductance may be improved in the region between the suppression electrode 805 and the ground electrode 807. It should be appreciated that improvements in gas conductance may also be provided in a (horizontal) direction toward an analyzer magnet (not shown).

Figure 9:
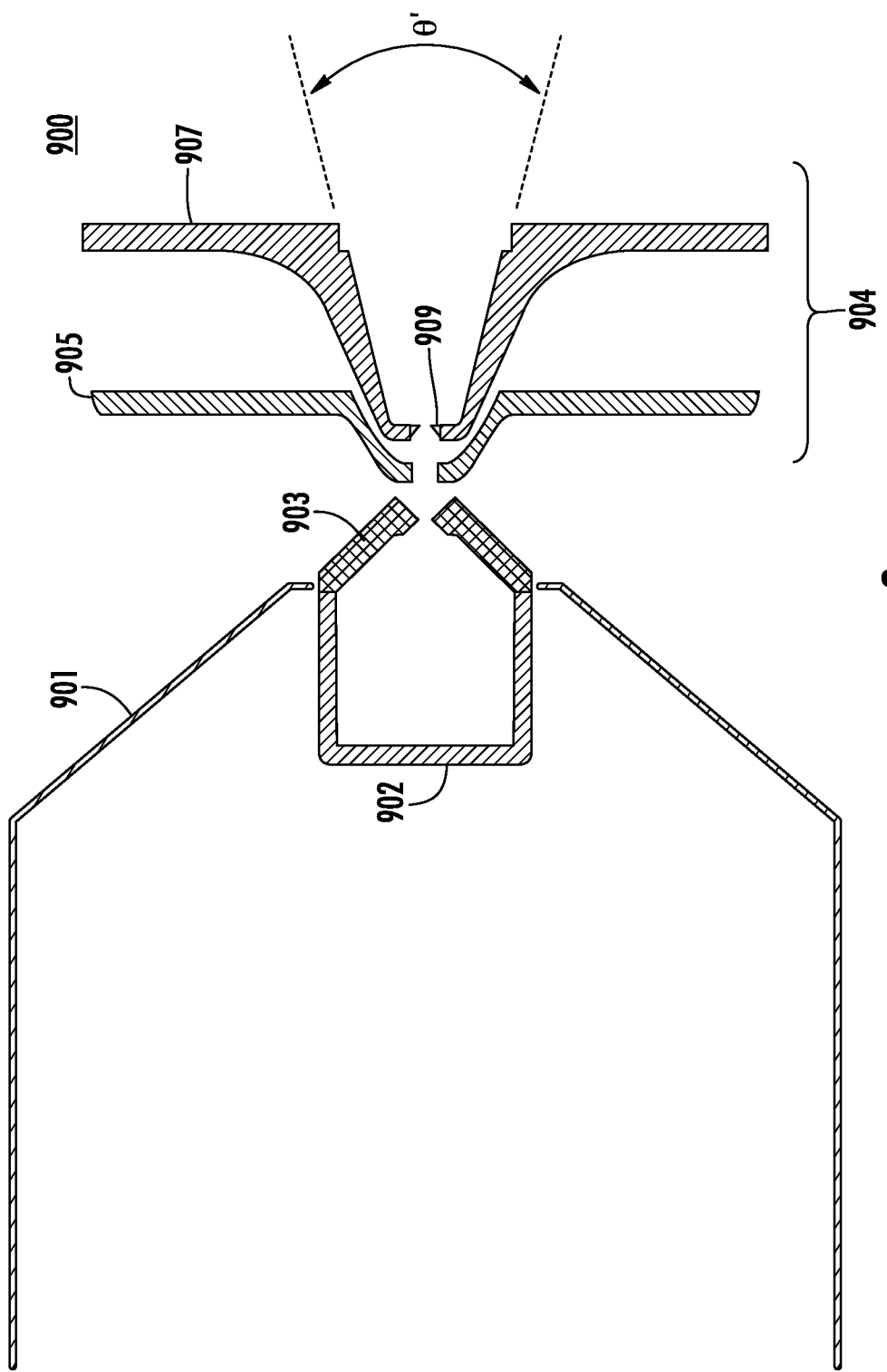
FIG. 9 depicts an ion source and extraction electrode configuration with a high-transparency ground electrode using anchors, according to another exemplary embodiment of the present disclosure.

It should be appreciated that anchors may also be provided at the high-transparency ground electrode 807 to alter pressure distribution in an extraction region (e.g., between the suppression electrode 805 and the high-transparency ground electrode 807). For example, FIG. 9 depicts an ion source and extraction electrode configuration 900 with a high-transparency ground electrode 907 using anchors 909 according to another exemplary embodiment of the present disclosure. In some embodiments the high-transparency ground electrode 907 using anchors 909 may better define stable plasma boundaries inside an extraction slot of the ground electrode 907. In other embodiments, the high-transparency ground electrode 907 using anchors 909 may provide a pressure gradient in a downstream region of an extracted ion beam path. This may provide increased pressure between the suppression electrode 905 and the high-transparency ground electrode 907 and reduce pressure within the high-transparency ground electrode 907 and in regions further downstream.

Embodiments of the present disclosure may provide improved extracted ion beam quality by optimizing gas conductance at an ion source and extraction electrodes. These techniques may separately or conjunctively reduce "beam wiggles" in an extracted ion beam profile. In doing so, desired correction to a shape of the ion beam may be provided. More specifically, greater ion beam uniformity, reliability, and predictability may be achieved and effected for improved ion implantation process.

It should be appreciated that while certain geometries have been described (e.g., protruded shapes, sizes, changes in angles/ratios, etc.), other geometric configurations for improving gas conductance and improving ion beam quality may also be provided.

It should be appreciated that while these embodiments of the present disclosure may be depicted and described as having certain shapes, cross-sectional shapes, numbers, angles, and sizes, other various shapes, cross-sectional shapes, numbers, angles, and sizes may also be considered.

It should also be appreciated that while embodiments of the present disclosure are directed to a high-transparency electrode configuration having a single slot or a double slot, other various configurations may also be provided. For example, a high-transparency electrode configurations having smaller or larger numbers of slots (e.g., configurations having single, multiple, or segmented electrodes) may also be provided.

It should also be appreciated that operation of the geometric configurations in the embodiments described above should not be restricted to ion source and extraction electrode configurations. For example, the various techniques and geometric configurations described above may also be applied to other ion implantation components as well.

It should be also appreciated that while embodiments of the present disclosure are directed to improving gas conductance and extracted ion beam quality, other implementations may be provided as well. For example, the disclosed techniques for utilizing various geometric ion source and extraction electrode configurations may also apply to other various ion implantation systems that use electric and/or magnetic deflection or any other beam collimating systems. Other various embodiments may also be provided.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for improving ion beam quality comprising:
    an ion source for generating an ion beam, the ion source comprising a faceplate with an aperture for the ion beam to travel therethrough; and
    a set of extraction electrodes comprising at least a suppression electrode and a high-transparency ground electrode having an overall height H comprising a base height y and a slot height x where the base height y is at least two times less than the slot height x, and a spacing between the suppression electrode and the base of the high-transparency ground electrode in a direction of travel of the ion beam is greater than 70% of the slot height x, and wherein the set of extraction electrodes extract the ion beam from the ion source via the faceplate, and wherein the high-transparency ground electrode together with the spacing is configured to optimize gas conductance between the suppression electrode and the high-transparency ground electrode for improved extracted ion beam quality.

2. The apparatus of claim 1, wherein the high-transparency ground electrode is configured with a base angle $\theta$, and a slot angle $\delta$.

3. The apparatus of claim 2, wherein the base angle $\theta$ is 20°.

4. The apparatus of claim 2, wherein the base angle $\theta$ is greater than 20°.

5. The apparatus of claim 4, wherein the base angle $\theta$ is 40°.

6. The apparatus of claim 1, wherein the high-transparency ground electrode is a single-slot high-transparency ground electrode or a double-slot high-transparency ground electrode.

7. The apparatus of claim 1, wherein the ion source is encased in a housing having a tapered configuration.

8. The apparatus of claim 1, wherein the faceplate is a protruded faceplate in which the faceplate protrudes toward the set of extraction electrodes.

9. The apparatus of claim 1, wherein the suppression electrode is a protruded suppression electrode.

10. The apparatus of claim 1, wherein the high-transparency ground electrode further comprises one or more anchor portions protruding into one or more extraction slots of the high-transparency ground electrode for defining stable plasma boundaries inside of the high-transparency ground electrode.

11. A method for improving ion beam quality comprising:
    providing an ion source comprising a plasma generator for generating an ion beam and a faceplate with an aperture for the ion beam to travel therethrough; and
    providing a set of extraction electrodes comprising at least a suppression electrode and a high-transparency ground electrode having an overall height H comprising a base height y and a slot height x where the base height y is at least two times less than the slot height x, and a spacing between the suppression electrode and the base of the high-transparency ground electrode in a direction of travel of the ion beam is greater than 70% of the slot height x, wherein the set of extraction electrodes extract the ion beam from the ion source via the faceplate, and wherein the high-transparency ground electrode together with the spacing is configured to optimize gas conductance between the suppression electrode and the high-transparency ground electrode for improved ion beam quality.

12. The method of claim 11, wherein the high-transparency ground electrode is configured with a base angle $\theta$, and a slot angle $\delta$.

13. The method of claim 12, wherein the base angle $\theta$ is 20°.

14. The method of claim 12, wherein the base angle $\theta$ is greater than 20°.

15. The method of claim 14, wherein the base angle $\theta$ is 40°.

16. The method of claim 11, wherein the high-transparency ground electrode is a single-slot high-transparency ground electrode or a double-slot high-transparency ground electrode.

17. The method of claim 11, wherein the ion source is encased in a housing having a tapered configuration.

18. The method of claim 11, wherein the faceplate is a protruded faceplate in which the faceplate protrudes toward the set of extraction electrodes.

19. The method of claim 11, wherein the suppression electrode is a protruded suppression electrode.

20. The method of claim 11, wherein the high-transparency ground electrode further comprises one or more anchor portions protruding into one or more extraction slots of the high-transparency ground electrode for defining stable plasma boundaries inside of the high-transparency ground electrode.

* * * * *